United States Patent
Kim et al.

(10) Patent No.: US 8,558,596 B2
(45) Date of Patent: Oct. 15, 2013

(54) PHASE INTERPOLATION CIRCUIT SUITABLE FOR WIDE RANGE FREQUENCY INPUT AND OUTPUT CHARACTERISTICS STABILIZING METHOD THEREOF

(75) Inventors: Bong-Jin Kim, Suwon-si (KR); Jongshin Shin, Anyang-si (KR); Hyun-Goo Kim, Yangju-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 214 days.

(21) Appl. No.: 13/152,571

(22) Filed: Jun. 3, 2011

(65) Prior Publication Data
US 2011/0298518 A1    Dec. 8, 2011

(30) Foreign Application Priority Data
Jun. 3, 2010    (KR) ........................ 10-2010-0052437

(51) Int. Cl.
*H03H 11/16*    (2006.01)
(52) U.S. Cl.
USPC .......................................... 327/231; 327/237
(58) Field of Classification Search
None
See application file for complete search history.

(56) References Cited

U.S. PATENT DOCUMENTS

| | | | |
|---|---|---|---|
| 7,363,563 B1* | 4/2008 | Hissen et al. | 714/733 |
| 7,423,469 B2 | 9/2008 | Pickering et al. | |
| 7,659,763 B2* | 2/2010 | Camara et al. | 327/292 |
| 7,872,515 B1* | 1/2011 | Kuo | 327/237 |
| 7,928,788 B2* | 4/2011 | Jiang | 327/231 |
| 2008/0001644 A1 | 1/2008 | Abel et al. | |
| 2010/0026349 A1* | 2/2010 | Jiang | 327/129 |
| 2010/0026367 A1* | 2/2010 | Jiang | 327/355 |
| 2010/0119024 A1* | 5/2010 | Shumarayev et al. | 375/371 |

FOREIGN PATENT DOCUMENTS

| | | |
|---|---|---|
| JP | 2008-227567 | 9/2008 |
| KR | 10-2001-0097770 A | 11/2001 |

* cited by examiner

*Primary Examiner* — Cassandra Cox
(74) *Attorney, Agent, or Firm* — Lee & Morse, P.C.

(57) ABSTRACT

A phase interpolation circuit includes a waveform shaping unit and a phase interpolator. The waveform shaping unit adaptively waveform-shapes first or second phase offset input clock signal pair that is applied, to output first and second buffered clock signals having a rising time and falling time each of more than about a quarter of a period of the first and second offset input clock signals. The phase interpolator is applied to generate a phase interpolation clock signal selected from phases between the first and second buffered clock signals in response to a weight value of a phase interpolation control signal.

16 Claims, 11 Drawing Sheets

PHASE INTERPOLATION CIRCUIT SUITABLE FOR WIDE RANGE FREQUENCY INPUT AND OUTPUT CHARACTERISTICS STABILIZING METHOD THEREOF

BACKGROUND

1. Field

The present disclosure herein relates to a phase interpolation circuit, and more particularly, to a phase interpolation circuit exactly and stably performing a phase interpolation operation even in a wide range frequency input, and an output characteristics stabilizing method thereof.

2. Description of the Related Art

A phase interpolation circuit that performs a phase interpolation operation in a clock data recovery circuit has been known in the related art.

A buffer having a fixed output resistance value is widely used in a phase interpolation circuit including a phase interpolator. Since such an interpolator is designed to show optimal performance with respect to only a preset frequency input, the pattern of phase interpolation output may be changed according to the shape of an input waveform in a wide range frequency input that falls outside the range of the present frequency input. Particularly, if an input waveform of a phase interpolator becomes a rectangular wave in a lower frequency, a phase interpolation output may be set to an erroneous value.

In order for a phase interpolator to generate a constant phase interpolation output of a phase step, the input waveform has to become closer to a triangular wave. If the input waveform becomes a rectangular wave, i.e., a differential input has a section having a DC value simultaneously, the phase interpolation output may have an uncertain value.

If a buffer having a fixed output resistance value is used in a wide range frequency input, it is difficult to provide the input waveform of the phase interpolator as a triangular wave at both a low frequency and a high frequency. Thus, a phase interpolation operation of the phase interpolator may not be accurately and stably performed. Accordingly, an improved technique capable of accurately and stably performing a phase interpolation operation is necessarily required over a wide range frequency input.

SUMMARY

The present disclosure provides a clock data recovery circuit including a phase interpolation circuit having an improved phase interpolation operation performance.

The present disclosure also provides a phase interpolation circuit ensuring phase interpolation operation performance even in a wide rage frequency input, and an output characteristics stabilizing method thereof.

The present disclosure also provides a phase interpolation circuit capable of always maintaining a phase step of constant resolution even in a wide rage frequency input, and a data processing device using the same.

Embodiments of the inventive concept provide phase interpolation circuits including a waveform shaping unit and a phase interpolator. The waveform shaping unit may be configured to receive a first or second phase offset input clock signal pair, to adaptively waveform-shaping first or second phase offset input clock signal pair, and to output first and second buffered clock signals having a rising time and falling time each of more than about a quarter of T, where T is a period of the first and second offset input clock signals. The phase interpolator may be configured to generate a phase interpolation clock signal selected from phases between the first and second buffered clock signals in response to a weight value of a phase interpolation control signal.

In some embodiments, the waveform shaping unit may include a current mode logic (CML) buffer in which an output resistance value is adaptively change according to a frequency of the first or second phase offset input clock signal pair.

In other embodiments, the waveform shaping unit may further include a skewed feedback loop to maintain a voltage swing level of the first and second buffered clock signals at a constant level regardless of the frequency.

In still other embodiments, the skewed feedback loop may include a skewed current mode logic (CML) buffer receiving the first and second buffered clock signals and generating feedback first and second clock signals that are skew-controlled, a converter receiving the feedback first and second clock signals and outputting a single clock pulse having a duty cycle corresponding thereto, and a control logic unit adaptively changing the output resistance value of the current mode logic (CML) buffer in response to the single clock pulse.

In even other embodiments, the first and second phase offset input clock signals of the first or second phase offset input clock signal pair may have a phase difference of about 90 degrees with respect to each other.

In yet other embodiments, the current mode logic (CML) buffer may include: first and second input nodes receiving the first or second phase offset input clock signal pair; first and second output nodes outputting the first and second buffered clock signals; a current source array including a plurality of parallel current sources; a first switch block including a plurality of switches, each of switches being connected in series to a corresponding current source in the current source array; a resistor array including resistor pairs installed corresponding to the plurality of parallel current sources, and connected to the first and second output nodes; a second switch block including switch pairs connected between corresponding resistor pairs of the resistor array and a power supply terminal, respectively; and an output resistance control unit connected to the current source array, the first and second input nodes, and the first and second output nodes to output the first and second buffered clock signals that are adaptively waveform-shaped according to the frequency of the first or second buffered clock signals pairs.

In further embodiments, the output resistance control unit may include a MOS transistor array including MOS transistor pairs.

In still further embodiments, the switches and switch pairs in the first and second switch blocks may be switched according to a counting code value of a counter.

In other embodiments of the inventive concept, methods for stabilizing output characteristics of a phase interpolator in a wide range frequency input include: providing a waveform shaping unit at a front end of the phase interpolator; and performing waveform-shaping such that first or second phase offset input clock signal becomes first and second clock signals having a rising time and falling time of more than about a quarter of T (where T is a period of first and second phase offset input clock signals) in response to a frequency of the first and second phase offset input clock signals applied to the phase interpolator.

In some embodiments, the waveform-shaping may be performed by a current mode logic (CML) buffer in which an output resistance value is adaptively changed according to an input frequency.

In other embodiments, the change of the output resistance value may be performed by a resistance connection switch that is switched according to a counting code value.

In still other embodiments, the method may further include skew-controlling for allowing voltage swing levels of the first and second buffered clock signals to be fixed at a constant level regardless of the input frequency.

In even other embodiments, the first and second phase offset input clock signals of the first or second phase offset input clock signal pair may have a phase difference of about 90 degrees with respect to each other.

In yet other embodiments, the phase interpolator may be applied to a clock data recovery circuit.

In still other embodiments of the inventive concept, data processing devices include a transmitting module and a receiving module including a clock data recovery circuit. The clock data recovery circuit may include a phase interpolation circuit including a waveform shaping unit configured to adaptively waveform-shaping a first phase offset input clock signal pair or a second phase offset input clock signal pair, to output first and second buffered clock signals having a rising time and falling time each of more than about a quarter of T, where T is a period of the first and second offset input clock signals, and a phase interpolator configured to generate a phase interpolation clock signal selected from phases between the first and second buffered clock signals in response to a weight value of a phase interpolation control signal, and a clock data recovery main part performing a clock data recovery operation using the phase interpolation output clock signal.

In some embodiments, the phase interpolator may receive four phase inputs to generate a phase interpolation output clock signal pair.

In other embodiments, the waveform shaping unit may include a current mode logic (CML) buffer in which an output resistance value is adaptively changed according to a frequency of the first or second phase offset input clock signal pair, and a skewed feedback loop allowing voltage swing levels of the first and second buffered clock signals to be at a constant level regardless of the frequency.

In still other embodiments, the skewed feedback loop may include a skewed current mode logic (CML) buffer receiving the first and second buffered clock signals and generating feedback first and second clock signals that are skew-controlled, a converter receiving the feedback first and second clock signals and outputting a single clock pulse having a duty cycle corresponding thereto, and a control logic unit adaptively changing the output resistance value of the current mode logic (CML) buffer in response to the single clock pulse.

In even other embodiments, the first and second phase offset input clock signals of the first or second phase offset input clock signal pair may have a phase difference of about 90 degrees with respect to each other at the same frequency.

In yet other embodiments, the data processing device may be a portable multimedia device.

In still other embodiments of the inventive concept, an input unit for a phase interpolator may include a waveform shaping unit configured to receive a first phase offset input clock signal pair or a second phase offset input clock signal pair, to adaptively waveform-shape the first or second phase offset input clock signal pair, and to output first and second buffered clock signals to the phase interpolator, the first and second buffered clock signals having a rising time and a falling time each of more than about a quarter of T, where T is a period of the first and second offset input clock signals.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
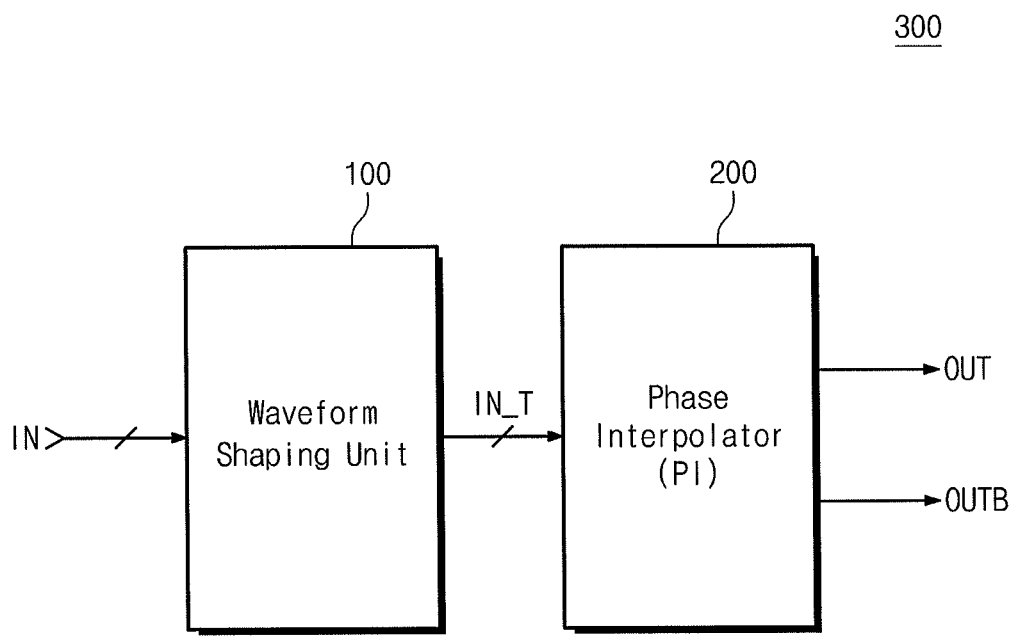
FIG. 1 illustrates a block diagram of a phase interpolation circuit according to an embodiment of the inventive concept.

Korean Patent Application No. 10-2010-0052437, filed on Jun. 3, 2010, in the Korean Intellectual Property Office, and entitled: "Phase Interpolation Circuit Suitable for Wide Range Frequency Input and Output Characteristics Stabilizing Method Thereof," is incorporated by reference herein in its entirety.

Example embodiments of inventive concepts will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concept to those skilled in the art.

In the present disclosure, if certain devices or lines are described as being connected to a target device block, they are not only directly connected to the target device block, but also connected to the target device block by means of any other device.

Also, the same or similar reference numerals provided in each drawing denote the same or similar components. In some drawings, connection relations between devices and lines are merely shown for efficient description of the technical spirit, and therefore other devices or circuit blocks may be further provided.

Exemplary embodiments set forth herein may include complementary embodiments thereof, and it will be noted that a general operation of a phase interpolator may be omitted so as not to obscure the essential point of the inventive concept.

Hereinafter, exemplary embodiments of the inventive concept will be described in detail with reference to the accompanying drawings.

FIG. 1 illustrates a block diagram of a phase interpolation circuit 300 according to an embodiment. Referring to FIG. 1, the phase interpolation circuit 300 may include a waveform shaping unit 100 and a phase interpolator 200.

The waveform shaping unit 100 may output first and second buffered clock signals having a rising time (RT) and a falling time (FT) of more than a quarter of T (here, T is a period of first and second phase offset input clock signals) through an output IN_T by adaptively shaping the waveforms of the first and second phase offset input clock signals applied through an input IN.

The phase interpolator 200 may generate phase interpolation output clock signals OUT and OUTB among phases between the first and second buffered clock signals in response to a weight value of a phase interpolation control signal.

Figure 2A:
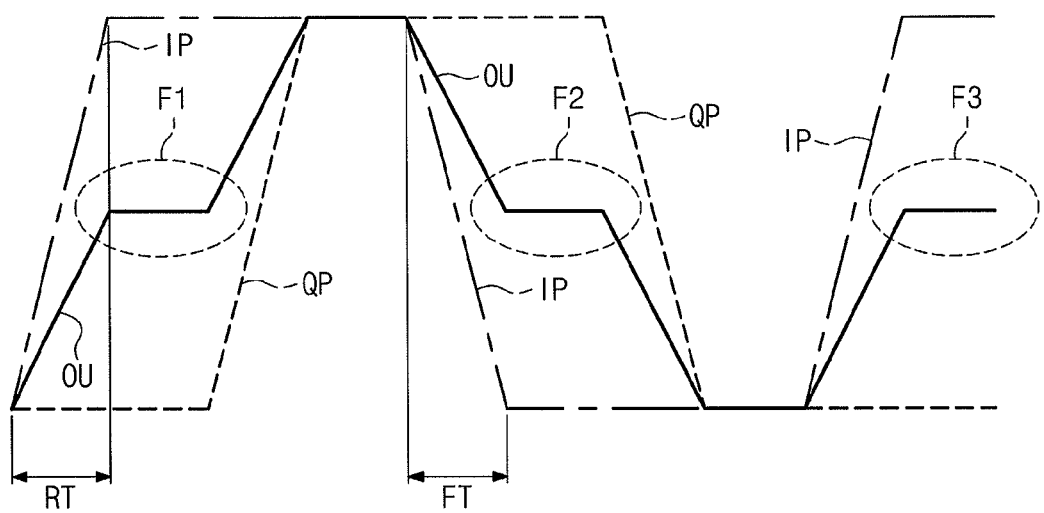
FIGS. 2A and 2B illustrate input/output waveforms for describing the phase interpolation output characteristics of a phase interpolator of FIG. 1.
Figure 2B:
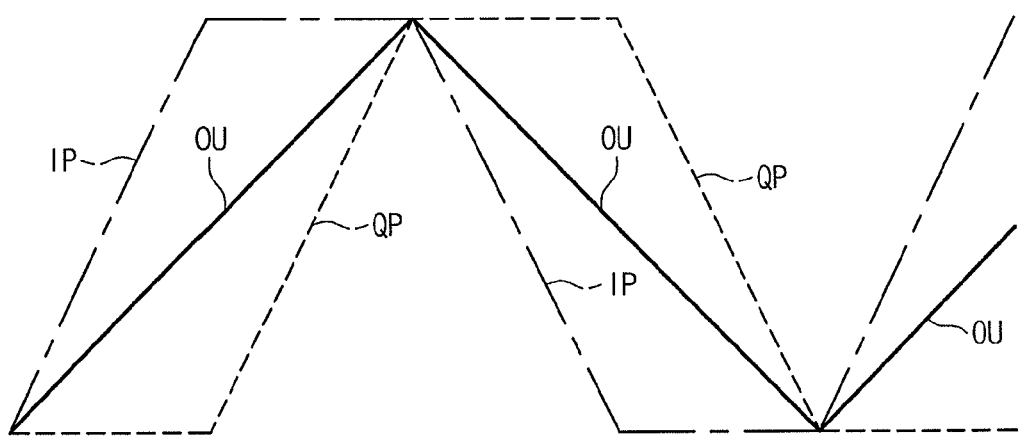

FIGS. 2A and 2B illustrate input/output waveforms for describing the phase interpolation output characteristics of the phase interpolator 200 of FIG. 1. In the drawings, the horizontal axis denotes time, and the vertical axis denotes the voltage level of input/output waveforms.

An input signal having an in-phase (IP), i.e., a phase of about 0 degrees, and an input signal having a quadrature-phase (QP), i.e., about 90 degrees, may be applied to the phase interpolator 200 of FIG. 1. The phase interpolator 200 may receive a weight value of a phase interpolation control signal as a digital code. A phase interpolation output clock signal selected between a phase of about 0 degree and a phase of about 90 degrees may be output according to a variation value of the digital code. For example, when a 4-bit digital code is used, phases from about 5.625 ($90 \times \frac{1}{16}$) degrees to about 84.375 ($90 \frac{15}{16}$) may be generated within a phase range from about 0 degree to about 90 degrees according to the variation of the code value.

As shown in FIG. 2A, when there is a section in which the IP and QP input signals simultaneously become a DC level, an output signal OU may have flat regions F1, F2, and F3, so that an interpolation output phase may be uncertain. In particular, since the rising time (RT) and the falling time (FT) of IP or QU are shorter than a quarter of the period T of IP or QP in FIG. 2A, the flat regions may be generated in the waveform of the output signal OU. The flat regions may be a main factor that makes the interpolation output of the phase interpolator 200 non-linear.

Accordingly, the waveform shaping unit 100 of FIG. 1 may increase RT and FT with respect to the IP and QP input signals to provide IP and QP as shown in FIG. 2B. Thus, the phase interpolator 200 may generate a phase interpolator output not having flat regions.

Even in a wide range frequency input, a method for adaptively controlling the magnitude of the output resistance of the waveform shaping unit according to a frequency input may be adopted to provide IP and QP as shown in FIG. 2B. This is because RT and FT of IP and QP are determined by the product of the output resistance R of the waveform shaping unit 100 and parasitic capacitance C of the input of the phase interpolator 200.

Figure 3:
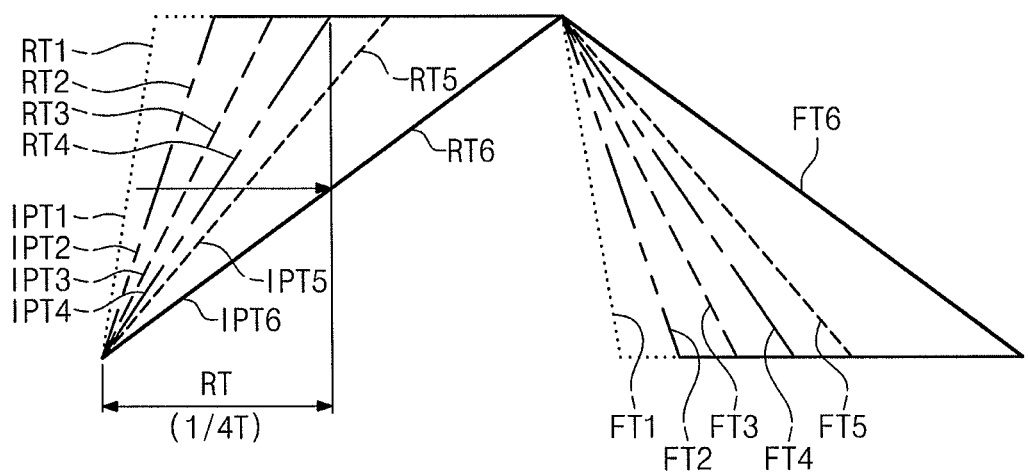
FIG. 3 illustrates various input waveforms according to the magnitude of an output resistance value of a waveform shaping unit.

FIG. 3 illustrates input waveforms according to the magnitude of an output resistance value of the waveform shaping unit 100. In the drawing, the horizontal axis denotes time, and the vertical axis denotes the voltage level of the waveform shaping unit 100 with respect to the output waveform.

In FIG. 3, a rising time RT2 of an output waveform IPT2 may be longer than a rising time RT1 of an output waveform IPT1. Also, a rising time RT3 of an output waveform IPT3 may be longer than the rising time RT2 of the output waveform IPT2, and so forth, through a rising time RT6, i.e., RT1<RT2<RT3<RT4<RT5<RT6. A falling time FT2 of the output waveform IPT2 may be longer than a falling time FT1 of the output waveform IPT1. Also, a falling time FT3 of the output waveform IPT3 may be longer than the falling time FT2, and so forth, through a falling time FT6, i.e., FT1<FT2<FT3<FT4<FT5<FT6. The rising and falling times of the output waveform may depend on the magnitude of the output resistance value of the waveform shaping unit 100. In particular, as the magnitude of the output resistance value of the waveform shaping unit 100 increases, the rising and falling times of the output waveform increase.

Thus, as noted above, by controlling the output resistance value of the waveform shaping unit 100, the rising and falling times of the output waveform may be increased to be longer than a quarter of the period T of the input waveform. Alternatively or additionally, the capacitance of a variable capacitor in the input of the phase interpolator 200 may be controlled to increase the rising and falling times of the output waveform to be longer than a quarter of the period T of the input waveform. However, since a method of controlling a capacitance using a variable capacitor requires a larger capacitor in a lower frequency, a relatively larger chip occupation area may be required. Also, compared to the method of controlling the output resistance value, the method of employing a variable capacitor may require higher power consumption.

Accordingly, in the present embodiment of the inventive concept, the input waveform applied to the phase interpolator 200 may be provided in a form of triangular wave having rising and falling times greater than a quarter of the period T, as shown in FIG. 3, by employing a method of adaptively controlling the output resistance of the waveform shaping unit 100. As illustrated in FIG. 3, output waveforms IPT4, IPT5, and IPT6 are triangular waveforms having rising and falling times that are greater than a quarter of the period T.

In the method of adaptively controlling the output resistance of the waveform shaping unit 100, if a bias current of the waveform shaping unit 100 is constantly maintained regardless of the magnitude of the output resistance, an input swing level of the phase interpolator 200 may be changed. Therefore, when the output resistance value is reduced, a small swing may be generated out of the input sensitivity of the phase interpolator 200.

Figure 4:
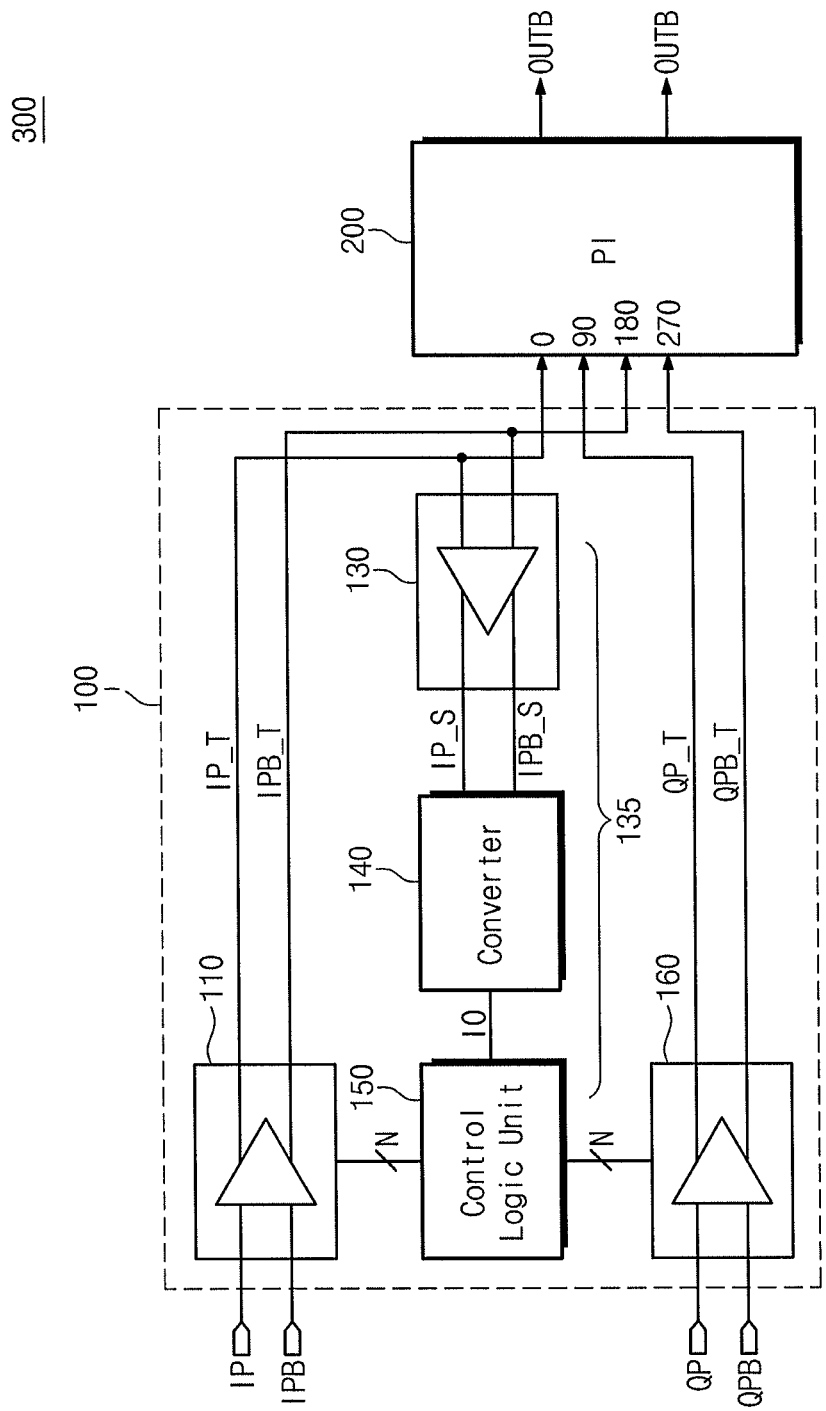
FIG. 4 illustrates a diagram of the phase interpolation circuit of FIG. 1 according to an embodiment.

To solve the above limitation in the present embodiment of the inventive concept, a scheme of simultaneously controlling the bias current according to the magnitude of the output resistance value of the waveform shaping unit may be adopted as shown in FIG. 4 to allow the input swing level of the interpolator 200 to be maintained at a constant level.

FIG. 4 illustrates a detailed diagram of the phase interpolation circuit 300 of FIG. 1 according to an embodiment.

Referring to FIG. 4, the waveform shaping unit 100 may include a current mode logic (CML) buffer 110 in which the output resistance value is adaptively changed according to the frequency of a first phase offset input clock signal pair IP and IPB. The waveform shaping unit 100 may also include a second current mode logic (CML) buffer 160 in which the output resistance value is adaptively changed according to the frequency of a second phase offset input clock signal pair QP and QPB.

The waveform shaping unit 100 may also include a skewed feedback loop 135 to allow the voltage swing level of first and second buffered clock signals IP_T and IPB_T to become a constant level regardless of the frequency. The skewed feedback loop 135 may include a skewed current mode logic (CML) buffer 130, a converter 140, and a control logic unit 150.

The skewed current mode logic (CML) buffer 130 may receive the first and second buffered clock signals IP_T and IPB_T to generate feedback first and second clock signals IP_S and IPB_S that are skew-controlled. The converter 140 may receive the feed back first and second clock signals IP_S and IPB_S to output a single clock pulse IO having a duty cycle corresponding thereto. The control logic unit 150 may allow the output resistance value of the CML buffer 100 to be adaptively changed in response to the single clock pulse 100.

The waveforms of IP/IPB and QP/QPB may have different phases, but may be signals of the same frequency. Accordingly, a counting code value N of the control logic unit 150 may be simultaneously provided to the CML buffer 110 and the second CML buffer 160.

In FIG. 4, the first phase offset input clock signal pair IP and IPB may be signals having a phase difference of about 180 degrees, and the first phase offset input clock signal IP may have a phase difference of about 90 degrees with respect to the second phase offset input clock signal QP.

Although, in FIG. 4, the skewed feedback loop 135 is connected to an output of the CML buffer 110 that receives the first phase offset input clock signal pair IP and IPB to generate the first and second buffered clock signals IP_T and IPB_T, the skewed feedback loop 135 may be connected to an output of the second CML buffer 160.

The first and second buffered clock signals IP_T and IPB_T generated through the CML buffer 110 may become a signal having a rising time and falling time of more than a quarter of T (here, T is a period of the first or second phase offset input clock signal), e.g., like one of the waveforms IPT4, IPT5, and IPT6.

The first and second buffered clock signals IP_T and IPB_T may be provided as an input of the phase interpolator 200, and may be simultaneously applied to the skewed CML buffer 130 of the skewed feedback loop 135.

By the operation of the skewed feedback loop 135, the output resistance value may be adaptively changed according to the frequency, and the voltage swing level of the first and second buffered clock signals IP_T and IPB_T may be maintained at a constant level regardless of the frequency.

The output resistance control value controlled by the control logic unit 150 of the skewed feedback loop 135 may become an N-bit counting code value output from an internal counter of the control logic unit 150. The counting code value may simultaneously determine the output resistances of the two CML buffers 110 and 160.

Figure 5:
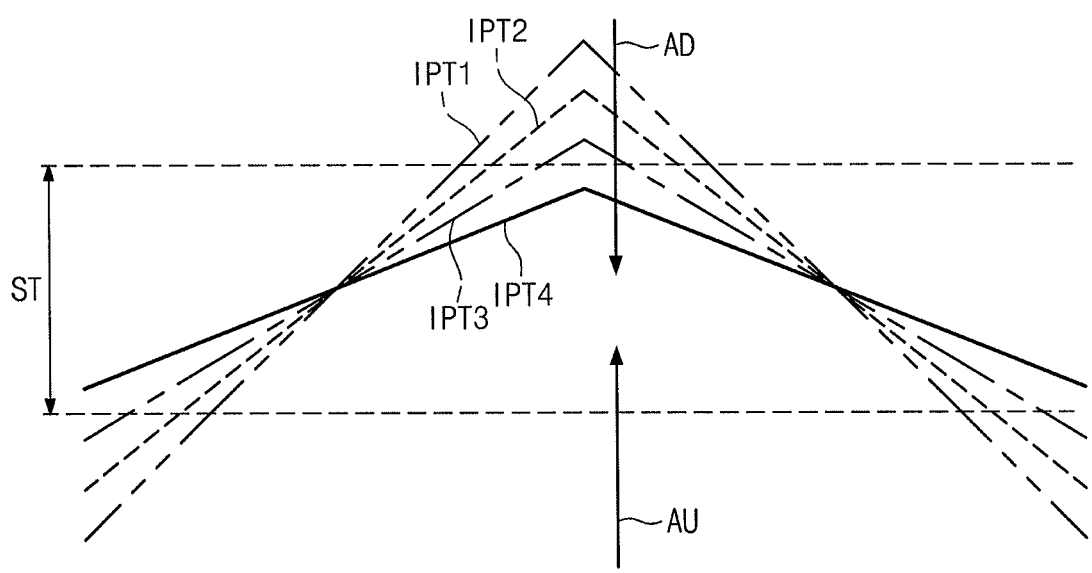
FIG. 5 illustrates a diagram of a swing level change of an input waveform according to an increase of an output resistance value in an operation of FIG. 4.

FIG. 5 illustrates a diagram of a swing level change of an input waveform according to an increase of an output resistance value in an operation of FIG. 4. In the drawing, the horizontal axis denotes time, and the vertical axis denotes voltage level.

In FIG. 5, one of the first and second buffered clock signals IP_T and IPB_T may be represented as one of waveforms IPT1 to IPT4 having different voltage swing levels. That is, although the buffered clock signal IP_T is shaped into a triangular wave because RT and FT is longer than a quarter of T by the operation of the CML buffer 110, the input swing level of the phase interpolator 200 may vary according to the frequency unless the bias current of the CML buffer 110 is changed regardless of the magnitude of the output resistance.

Accordingly, in order to solve a limitation of a small swing falling outside the input sensitivity of the phase interpolator 200, the input swing level of the phase interpolator 200 needs to be also maintained at a constant level.

The waveforms IPT1 to IPT4 shown in FIG. 5 may have an increased RT and FT as the RC value increases.

As described in FIG. 3, if the R value of the CML buffer 110 increases, RT and FT of the buffered clock signal IP_T. If the increment of RT and FT is beyond a certain range, RT or FT may become longer than the half of the period T. In this case, the input swing level of the phase interpolator 200 may be gradually reduced as shown in FIG. 5. In FIG. 5, ST represents a voltage level of a swing threshold. The input swing level of the phase interpolator 200 may be maintained at a constant level when the reduction of the voltage swing level is detected. The skewed CML buffer 130 may serve as a function block detecting the voltage swing level and performing a skew control operation. The operation of the skewed feedback loop 135 including the skewed CML buffer 130 will be described in detail with reference to FIG. 5.

Figure 6:
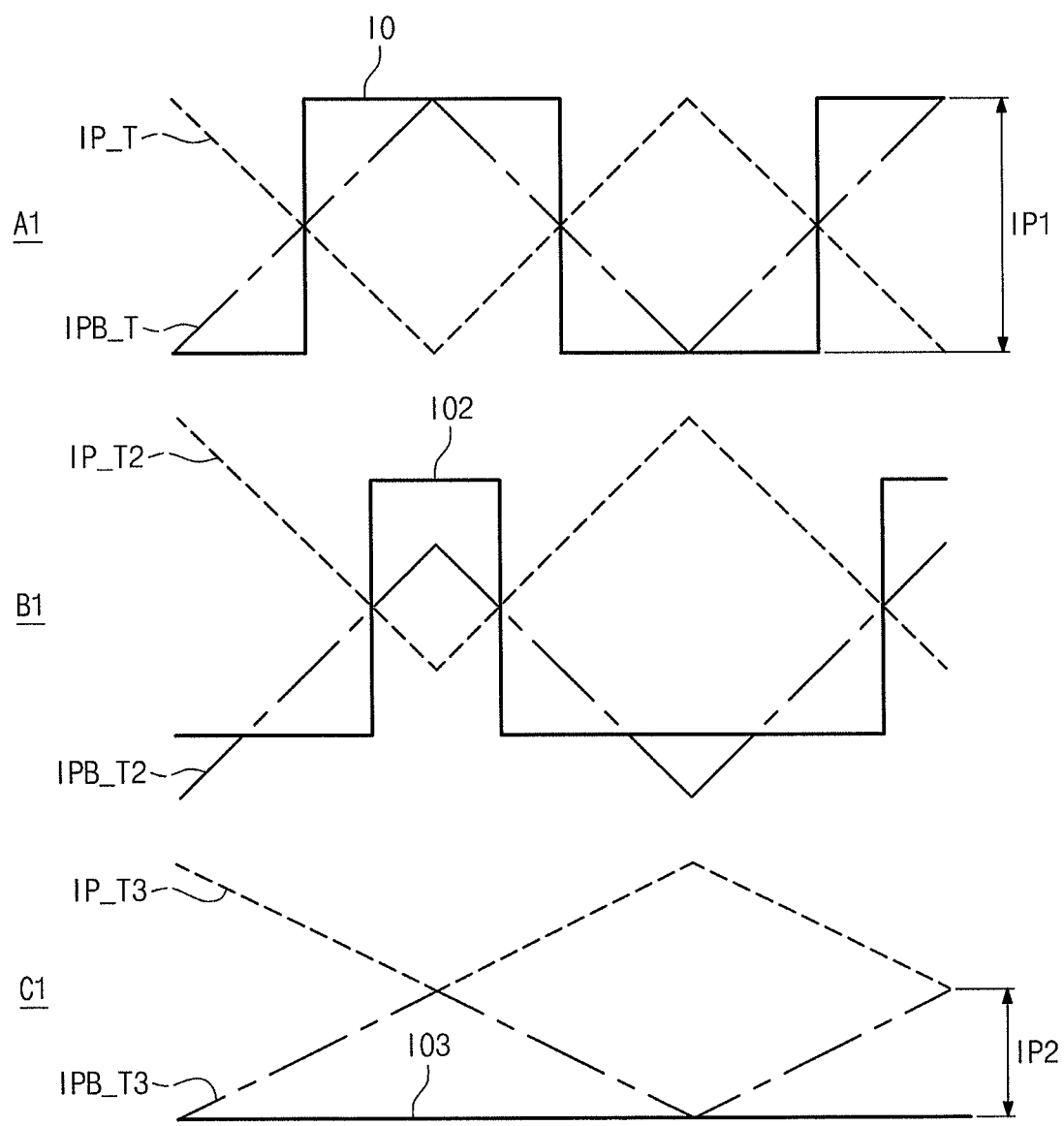
FIG. 6 illustrates a converter output waveform related to an operation of FIG. 4.

FIG. 6 illustrates a converter output waveform related to the operation of FIG. 4. Referring to FIG. 6, the swing level changes of IP_T and IPB_T in FIG. 4 may be represented as three stages A1, B1, and C1.

A waveform IO of the first stage A1 may appear in an initial operation in which a swing level is not stabilized. A waveform IO of the second stage B1 may appear in an operation after skew-control by the buffer 130. A waveform IO of the third stage C1 may appear when, after the operation of the second stage, the reduction of the swing level is detected as shown in FIG. 5, and a constant voltage swing level is provided.

When IP_T/IPB_T undergo full swing at a voltage level IP1 in the initial operation, the output IO of the converter 140 of FIG. 4 may have a duty of about 50% as shown in the first stage A1. If a skew control is performed through the skewed CML buffer 130 of FIG. 4, the duty of the output IO may be reduced as shown in the second stage B1. Finally, if the voltage levels of IP_T/IPB_T are reduced by an output resistance control operation of the CML buffer 110 of FIG. 4, the output IO may be output as about 0 as shown in the stage C1. If the output IO is given as about 0, a counting code value output from the counter of the control logic unit 150 may be fixed to a certain value, and the feedback operation of the skewed feedback loop 135 may be substantially stopped. As a result, the swing level of IP_T/IPB_T may be fixed.

Accordingly, input signals applied to the phase interpolators 200 may be provided as first and second buffered clock signals having a rising time RT and falling time FT of more than a quarter of T, and may allow the voltage swing level of the clock signals to be at a constant level regardless of the frequency.

Referring again to FIG. 4, the phase interpolator 200 shown in the drawing may receive four phase outputs output from the waveform shaping unit 100 to generate a phase interpolation output clock signal selected within a specific phase range with respect to a wide range frequency input.

Figure 7:
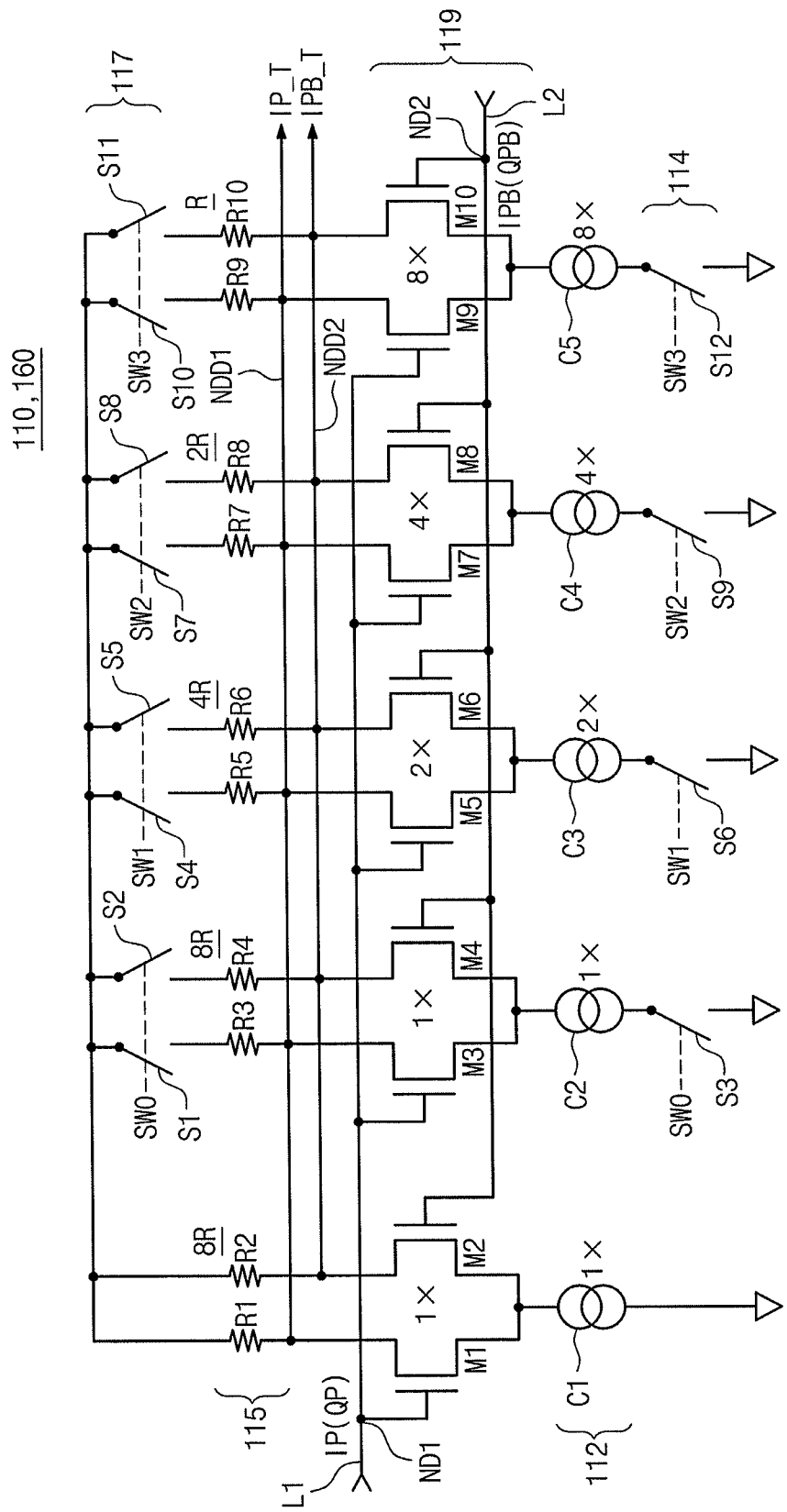
FIG. 7 illustrates a detailed circuit diagram of the buffer of FIG. 4 according to an example embodiment.

FIG. 7 illustrates a detailed circuit diagram of an exemplary CML buffer of FIG. 4. The CML buffer 110 or the second CML buffer 160 of FIG. 4 may be implemented as the CML buffer of FIG. 7.

When functioning as the CML buffer 110, the first phase offset input clock signal IP and the complementary first phase offset input clock signal IPB may be applied to first and second input nodes ND1 and ND2, respectively. Here, the clock signals IP and IPB may become the first phase offset input clock signal pair.

When functioning as the CML buffer 160, the second phase offset input clock signal QP and the complementary second phase offset input clock signal QPB may be applied to the first and second input nodes ND1 and ND2, respectively. Here, the clock signals QP and QPB may become the second phase offset input clock signal pair.

The CML buffer of FIG. 7 may include first and second input nodes ND1 and ND2, first and second output nodes NDD1 and NDD2, a current source array 112, a first switch block 114, a resistor array 115, a second switch block 117, and an output resistance control unit 119.

The first and second input nodes ND1 and ND2 may receive one of the first and second phase offset input clock signal pairs. The first and second output nodes NDD1 and NDD2 may output the first and second buffered clock signals IP_T and IPB_T.

The current source array 112 may include a plurality of parallel current sources C1 to C5. The first switch block 114 may include a plurality of switches S3, S6, S9, and S12, each of which is connected in series to a corresponding current source in the current source array 112. The resistor array 115 may have resistor pairs installed corresponding to the plurality of parallel current sources C1 to C5, and may be connected to the first and second output nodes. The second switch block 117 may include switch pairs S1-S2, S4-S5, S7-S8 and S10-S11 connected between a power supply terminal and corresponding resistor pairs in the resistor array 115, respectively.

The output resistance control unit 119 may be connected to the current source array 112, the first and second input nodes ND1 and ND2, and the first and second output nodes NDD1 and NDD2 to output the first and second buffered clock signals that are adaptively waveform-shaped according to the frequency of the first or second buffered clock signals pairs. The output resistance control unit 119 may include a MOS transistor array including a plurality of MOS transistor pairs M1-M2, M3-M4, M5-M6, M7-M8, and M9-M10.

The switches and switch pairs in the first and second switch blocks 114 and 117 may be switched according to a counting code value of the counter of the control logic unit 150 of FIG. 4. In FIG. 7, the counting code value may be applied as switching signals, e.g., SW0, SW1, SW2, and SW3. Assuming that all of the switches are closed when the code value is 1, and the switches are opened when the code value is 0, all of SW0, SW1, SW2, and SW3 may become 1 when a 4-bit counting code value is applied as 1111, and switches corresponding thereto may all be closed. On the other hand, since all of SW0, SW1, SW2, and SW3 become 0 if the 4-bit counting code value is applied as 0000, switches corresponding thereto may all be open. The output resistance value of the CML buffer of FIG. 7 may be the greatest, e.g., 8R, when the switches are all open (or off), and may be the smallest, e.g., R/2, when the switches are all closed (or on).

The initial operation of FIG. 7 may start from a state where the output resistance value of the CML buffer 110 is set to R/2 by applying 1111 to the 4-bit counting code value. In this case, if RT and FT of the first and second buffered clock signals IP_T and IPB_T are identical to or smaller than a quarter of T, shaping into a triangular wave is not yet performed. Accordingly, the 4-bit counting code value may be applied as 1110 to increase the output resistance value. Thus, the switches S10-S11, and S12 corresponding to SW3 may be opened to allow the output resistance value of the CML buffer 110 to become greater than R/2. Continuously, if RT and FT of the first and second buffered clock signals IP_T and IPB_T are identical to or smaller than a quarter of T, the 4-bit counting code value may be finally applied as 0000.

In the case of the wide range frequency input, input signals applied to the phase interpolator 200 may be provided as a triangular wave, by adaptively turning of/off the switch and switch pair in the first and second switch blocks 114 and 117.

In this case, by the above-described operation of the skewed feedback loop 135, the swing level of the input signals applied to the phase interpolator 200 may be constantly maintained regardless of the on/off state of the switch and switch pair.

Figure 8:
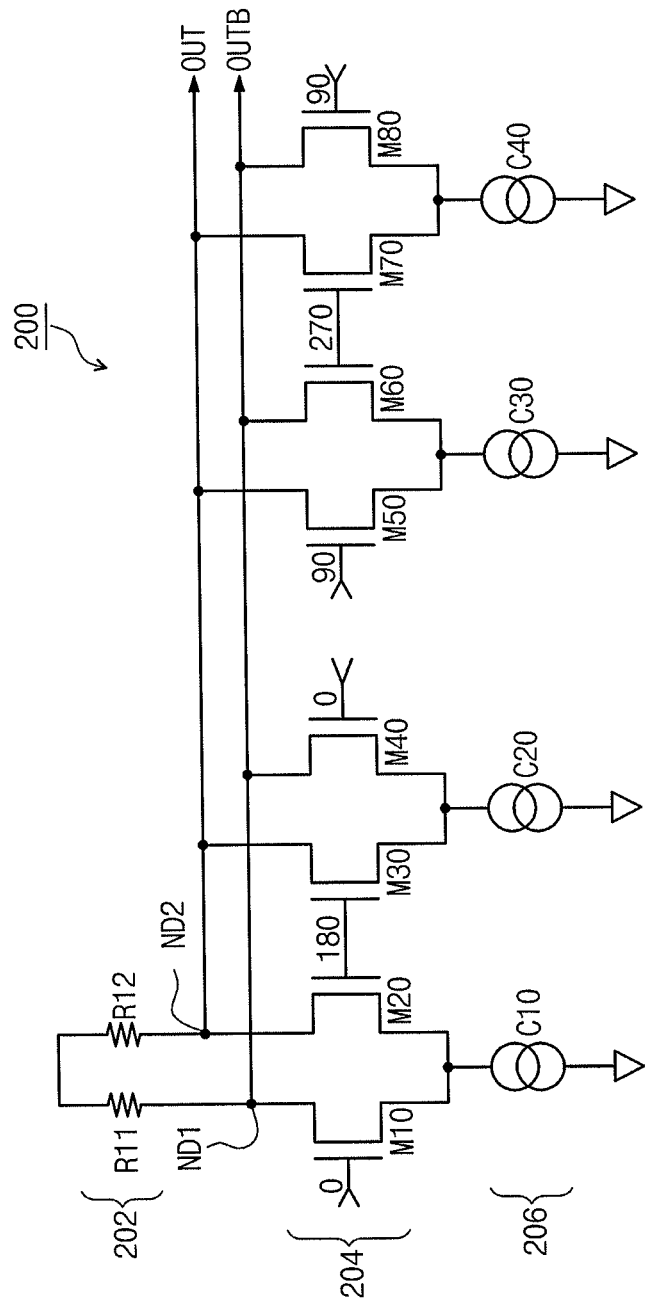
FIG. 8 illustrates a detailed circuit diagram of the phase interpolator of FIG. 1 according to an example embodiment.

FIG. 8 illustrates a detailed circuit diagram of the phase interpolator 200 of FIG. 1 according to an example embodiment.

Referring to FIG. 8, the phase interpolator 200 may include a resistor pair 202, a transistor array 204, and a current source array 206. The resistor pair 202 may include resistors R11 and R12. The transistor array 204 may include NMOS transistors M10, M20, M30, M40, M50, M60, M70, and M80. The current source array 206 may include current sources C10, C20, and C40.

The resistor R11 may be connected between an internal voltage VD and a node ND12. Phase interpolation output clock signals OUT and OUTB may be output from nodes ND12 and ND11. Here, the phase interpolation output clock signals OUT and OUTB may be signals of differential form.

The drains of the NMOS transistors M10, M40, M60, and M80 may be connected to the node ND11, and the drains of the NMOS transistors M20, M30, M50, and M70 may be connected to the node ND12. The sources of the NMOS transistors M10 and M20 may be connected to the current source C10, and the sources of the NMOS transistors M30 and M40 may be connected to the current source C20. Also, the sources of the NMOS transistors M50 and M60 may be connected to the current source C30, and the sources of the NMOS transistors M70 and M80 may be connected to the current source C40.

The gates of the NMOS transistors M10 and M40 may become an input 0 of FIG. 4 to receive the signal IP_T, and the gates of the NMOS transistors M50 and M80 may become an input 90 of FIG. 4 to receive the signal QP_T. The gates of the NMOS transistors M20 and M30 may become an input 180 of FIG. 4 to receive the signal IPB_T, and the gates of the NMOS transistors M60 and M70 may become an input 270 of FIG. 4 to receive the signal QPB_T.

The phase interpolator 200 may generate the phase interpolation output clock signals OUT and OUTB having a certain phase in the nodes ND11 and ND12, according to the state of the output of the signals IP_T and IPB_T and the output of the signals QP_T and QPB_T. Since the amount of the tail current source in the phase interpolator 200 is changed by the four phase inputs IP_T/IPB_T, and QP_T/QPB_T applied to the phase interpolator 200, a specific phase output OUT/OUTB may be thereby obtained.

Since the phase interpolator 200 may receive an input waveform having a voltage swing level of constant level even in a wide range frequency input as a triangular wave, a phase interpolation operation may be accurately and stably performed.

Figure 9:
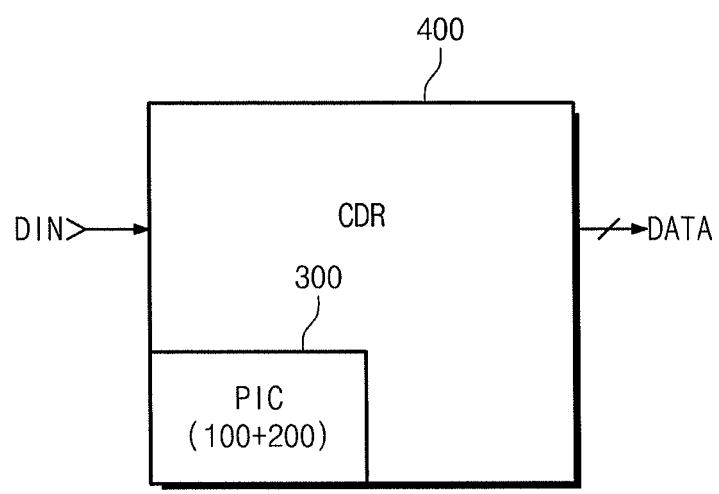
FIG. 9 illustrates a block diagram of a clock data recovery circuit in which the phase interpolation circuit according to an embodiment of the inventive concept is employed.

FIG. 9 illustrates a block diagram of a clock data recovery circuit in which a phase interpolation circuit 300 according to an embodiment of the inventive concept is employed. Referring to FIG. 9, a clock data recovery circuit 400 may include the phase interpolation circuit 300 as shown in FIG. 1.

When high-speed serial data is received through an input DIN, the clock data recovery circuit 400 may restore a transmission frequency block from the received serial data, and may serve to restore the serial data to transmission data upon transmission. Transmitting and receiving of serial data in a high-speed data communication may have advantages in that the number of channels is reduced compared to parallel, and speed can be increased because an inter-symbol interference is reduced. In order to accurately restore data, a phase of data that is received and a phase of a frequency clock that is restored have to be exactly synchronized with each other. Accordingly, when the phase interpolation circuit 300 as shown in FIG. 1 is employed in the clock data recovery circuit 400, the phase interpolation operation may be accurately and stably performed even in a wide range frequency input. Accordingly, performance of clock and data recovery can increase.

Figure 10:
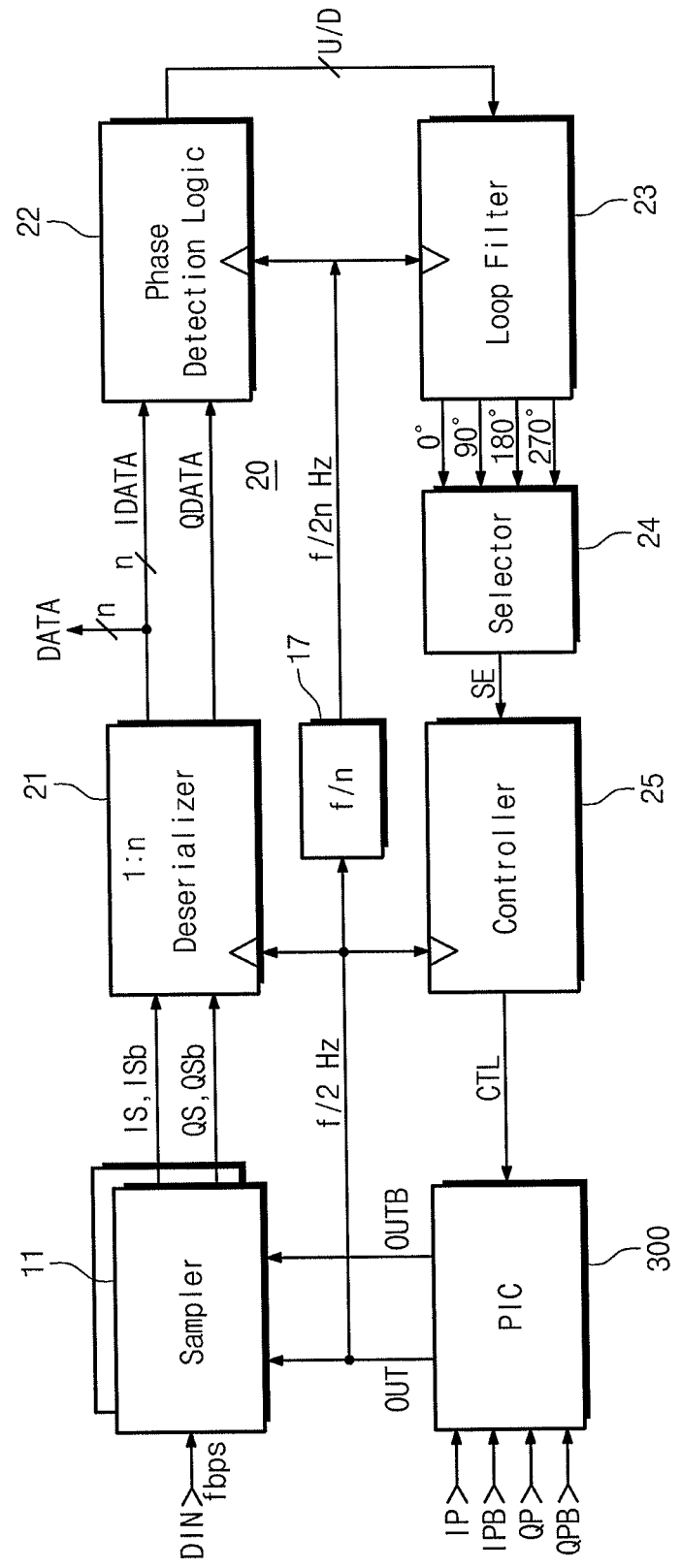
FIG. 10 illustrates a diagram of the clock data recovery circuit of FIG. 9 according to an example embodiment.

FIG. 10 illustrates a diagram of an example of the clock data recovery circuit of FIG. 9. Referring to FIG. 10, the clock data recovery circuit 400 may include a sampler 11, a deserializer 21, a phase detection logic 22, a loop filter 23, a selector 24, a controller 25 for controlling phase interpolation, a phase interpolation circuit 300, and a frequency divider 17. The phase detection logic 22, the loop filter 23, the selector 24, the controller 25, and the deserializer 21 configured with a serial-parallel data converter may be called a clock & data recovery loop.

Four reference clock signals IP, QP, IPB and QPB having a frequency of about f/2 Hz and a phase difference of about 90 degrees are generated in a phase synchronization circuit. Here, the four reference clock signals IP, QP, IPB and QPB may have phases of about 0 degree, 90 degrees, 180 degrees, and 270 degrees, respectively. The phase interpolation circuit 300 may receive four reference clock signals IP, QP, IPB, and QPB from the phase fixation loop 18, and may output interpolation clock signals OUT and OUTB by adjusting the phases of the four reference clock signals IP, QP, IPB, and QPB according to a phase control signal CTL output from the controller 25. Here, a differential interpolation clock signal of the interpolation clock signals OUT and OUTB may be output together.

The interpolation clock signals OUT and OUTB and the differential interpolation clock signal may have a frequency of about f/2 Hz, respectively. The phase control signal CTL may be input at such a relatively high rate that the phase interpolation circuit 300 may control the phase not to be slower than the input serial data DIN.

The frequency divider 17 may receive one of the interpolation clock signals to convert it into a clock signal having a frequency corresponding to about 1/n, i.e., a frequency of about f/2n Hz, and then may supply the clock signal to the phase detection logic 22 and the loop filter 23 as an operation clock. A relatively slower clock signal may be supplied to a low-speed operation portion of the deserializer 21 that does not require a relatively high-speed operation, the phase detection logic 22, and the loop filter. On the other hand, a relatively faster clock signal having a frequency of about f/2 Hz may be supplied to a high-speed operation portion of the deserializer 21 that requires a relatively high-speed operation, and the controller 25.

For example, if the input serial data DIN is about 6 Gbps, and n is 20, a clock signal of about 3 GHz may be supplied to the high-speed operation portion of the deserializer 21 and the controller 25 as an operation clock, and a clock signal of about 300 MHz may be supplied to the low-speed operation portion of the deserializer 21, the phase detection logic 22, and the loop filter 23.

The sampler 11 may extract four serial sampling pulses IS, QS, ISb and QSb by sampling the input serial data DIN of f bps using four interpolation clock signals having a substantial phase difference of about 90 degrees. For example, if the input serial data DIN is 6 Gbps, and four samplers 11 are used, the four samplers 11 may sample the input serial data DIN of about 6 Gbps using a frequency of about 3 GHz to generate four serial sampling pulses IS, QS, ISb, and QSb of about 3 GHz.

The deserializer 21 may receive the four serial sampling pulses IS, QS, ISb, and QSb to convert the pulses into two n-bit parallel data IDATA and QDATA. In this case, the parallel data IDATA may be generated from the serial sampling pulses IS and ISb, and the parallel data Qdata may be generated from the serial sampling pulses QS and QSb. For example, if n is 20, the parallel data IDATA may include 20 pulses that are sampled from the serial sampling pulses using interpolation clock signals having phases of about 0 degree and 180 degrees, and the parallel data QDATA may include 20 pulses that are sampled from the serial sampling pulses using interpolation clock signals having phases of about 90 degrees and about 270 degrees. One of the n-bit parallel data IDATA and QDATA may be output to the outside as recovered data DATA. Accordingly, the circuit of FIG. 10 may recover both clock and data.

Figure 11:
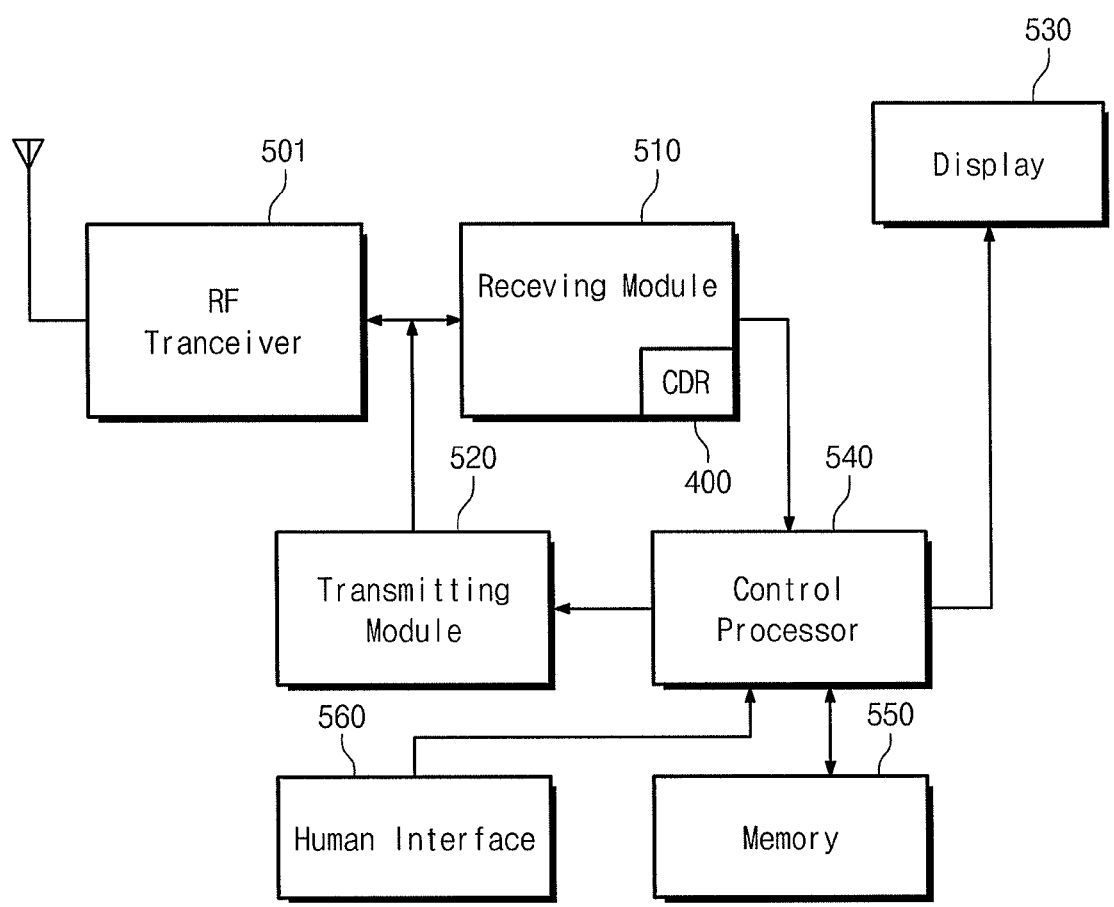
FIG. 11 illustrates a block diagram of a data processing device in which the circuit of FIG. 10 is employed.

FIG. 11 illustrates a block diagram of a data processing device in which the circuit of FIG. 10 is employed. Referring to FIG. 11, the data processing device may include a radio-frequency (RF) transceiver 501, a receiving module 510, a transmitting module 520, display 530, a control processor 540, a memory 550, and a human interface 560.

The memory 550 may be used as a code storage or a data storage. The memory 550 may include a nonvolatile memory device such as a flash memory, or a volatile memory device such as an SDRAM. The nonvolatile memory device may constitute a solid state drive/disk (SSD)

In FIG. 11, the receiving module 510 may include a clock data recovery circuit 400 as shown in FIG. 10 to receive data. Since the clock data recovery circuit 400 may be configured as shown in FIG. 9, clock and data recovery performance is excellent in a wide range frequency input. The data processing device of FIG. 11 may become a mobile device.

The mobile device may become a notebook computer or one of cellular phones, PDA digital cameras, portable game consoles, and MP3 players. Although not shown in the drawing, the mobile device may be provided with a battery supplying an operation voltage necessary for operation of the device, and a power supply for more efficiently using the power of the battery. Also, an application chipset and a camera image processor (CIS) may be further provided.

According to embodiments of the inventive concept, a phase interpolation operation can be accurately and stably performed even in a wide frequency input. Accordingly, operation performance of a data processing device employing a phase interpolation circuit can be substantially improved.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A phase interpolation circuit, comprising:
    a waveform shaping unit configured to receive a first phase offset input clock signal pair or a second phase offset input clock signal pair, to adaptively waveform-shape the first or second phase offset input clock signal pair, and to output first and second buffered clock signals having a rising time and a falling time each of more than about a quarter of T, where T is a period of the first and second offset input clock signals, wherein the waveform shaping unit includes
  a current mode logic buffer in which an output resistance value is adaptively changed according to a frequency of the first or second phase offset input clock signal pair, and
  a skewed feedback loop that maintains a voltage swing level of the first and second buffered clock signals at a constant level regardless of frequency, the skewed feedback loop including:
    a skewed current mode logic buffer configured to receive the first and second buffered clock signals and to generate feedback first and second clock signals that are skew-controlled.,
    a converter configured to receive the feedback first and second clock signals and to output a single clock pulse having a duty cycle corresponding thereto, and
    a control logic unit configured to adaptively change the output resistance value of the current mode logic buffer in response to the single clock pulse; and
  a phase interpolator configured to generate a phase interpolation clock signal selected from phases between the first and second buffered clock signals in response to a weight value of a phase interpolation control signal.

2. The phase interpolation circuit as claimed in claim 1, wherein the current mode logic buffer comprises:
  first and second input nodes receiving the first or second phase offset input clock signal pair;
  first and second output nodes outputting the first and second buffered clock signals;
  a current source array including a plurality of parallel current sources;
  a first switch block including a plurality of switches, each of switches being connected in series to a corresponding current source in the current source array;
  a resistor array including resistor pairs installed corresponding to the plurality of parallel current sources, and connected to the first and second output nodes;
  a second switch block including switch pairs connected between corresponding resistor pairs of the resistor array and a power supply terminal, respectively; and
  an output resistance control unit connected to the current source array, the first and second input nodes, and the first and second output nodes to output the first and second buffered clock signals that are adaptively waveform-shaped according to the frequency of the first or second buffered clock signals pairs.

3. The phase interpolation circuit as claimed in claim 2, wherein the output resistance control unit comprises a MOS transistor array including MOS transistor pairs.

4. The phase interpolation circuit as claimed in claim 2, wherein the switches and switch pairs in the first and second switch blocks are switched according to a counting code value of a counter.

5. The phase interpolation circuit as claimed in claim 1, wherein the first and second phase offset input clock signals of the first or second phase offset input clock signal pair have a phase difference of about 90 degrees with respect to each other.

6. A method for stabilizing output characteristics of a phase interpolator, the method comprising:
  performing waveform-shaping such that a first phase offset input clock signal pair or a second phase offset input clock signal pair become first and second clock signals having a rising time and a falling time each of more than about a quarter of T, where T is a period of first and second phase offset input clock signals, in response to a frequency of the first and second phase offset input clock signals applied to the phase interpolator, wherein waveform-shaping includes adaptively changing an output resistance value according to an input frequency by switching a resistance connection switch according to a counting code value; and
  supplying the first and second clock signals to the phase interpolator.

7. The method as claimed in claim 6, further comprising skew-controlling for maintaining voltage swing levels of the first and second buffered clock signals at a constant level regardless of the input frequency.

8. The method as claimed in claim 6, wherein, when the first phase offset input clock signal and the second phase offset input clock signal have a phase difference of about 90 degrees with respect to each other.

9. The method as claimed in claim 6, wherein the phase interpolator is applied to a clock data recovery circuit.

10. A data processing device, comprising:
  a transmitting module; and
  a receiving module having a clock data recovery circuit, the clock data recovery circuit including:
    a phase interpolation circuit including:
      a waveform shaping unit configured to receive a first phase offset input clock signal pair or a second phase offset input clock signal pair, to adaptively waveform-shape the first or second phase offset input clock signal pair, and to output first and second buffered clock signals having a rising time and a falling time each of more than about a quarter of T, where T is a period of the first and second offset input clock signals, wherein the waveform shaping unit includes:
        a current mode logic buffer in which an output resistance value is adaptively changed according to a frequency of the first or second phase offset input clock signal pair, and
        a skewed feedback loop maintaining voltage swing levels of the first and second buffered clock signals at a constant level regardless of the frequency, the skewed feedback loop including:
          a skewed current mode logic buffer configured to receive the first and second buffered clock signals and to generate feedback first and second clock signals that are skew-controlled;
          a converter configured to receive the feedback first and second clock signals and to output a single clock pulse having a duty cycle corresponding thereto; and
          a control logic unit configured to adaptively change the output resistance value of the current mode logic (CML) buffer in response to the single clock pulse; and
      a phase interpolator configured to generate a phase interpolation clock signal selected from phases between the first and second buffered clock signals in response to a weight value of a phase interpolation control signal; and
    a clock data recovery main part performing a clock data recovery operation using the phase interpolation output clock signal.

11. The data processing device as claimed in claim 10, wherein the phase interpolator receives four phase inputs to generate a phase interpolation output clock signal pair.

12. The data processing device as claimed in claim 10, wherein the first and second phase offset input clock signals of the first or second phase offset input clock signal pair has a phase difference of about 90 degrees with respect to each other.

13. An input unit for a phase interpolator, the input unit comprising:
- a waveform shaping unit configured to receive a first phase offset input clock signal pair or a second phase offset input clock signal pair, to adaptively waveform-shape the first or second phase offset input clock signal pair, and to output first and second buffered clock signals to the phase interpolator, the first and second buffered clock signals having a rising time and a falling time each of more than about a quarter of T, where T is a period of the first and second offset input clock signals the waveform shaping unit including:
  - a current mode logic buffer in which an output resistance value is adaptively changed according to a frequency of the first or second phase offset input clock signal pair, and
  - a skewed feedback loop that maintains a voltage swing level of the first and second buffered clock signals at a constant level regardless of frequency, the skewed feedback loop including:
    - a skewed current mode logic buffer configured to receive the first and second buffered clock signals and to generate feedback first and second clock signals that are skew-controlled,
    - a converter configured to receive the feedback first and second clock signals and to output a single clock pulse having a duty cycle corresponding thereto, and
    - a control logic unit configured to adaptively change the output resistance value of the current mode logic buffer in response to the single clock pulse.

14. A phase interpolation circuit, comprising:
- a waveform shaping unit configured to receive a first phase offset input clock signal pair or a second phase offset input clock signal pair, to adaptively waveform-shape the first or second phase offset input clock signal pair, and to output first and second buffered clock signals having a rising time and a falling time each of more than about a quarter of T, where T is a period of the first and second offset input clock signals, wherein the waveform shaping unit includes a current mode logic buffer in which an output resistance value is adaptively changed according to a frequency of the first or second phase offset input clock signal pair, the current mode logic buffer including:
  - a first and second input nodes receiving the first or second phase offset input clock signal pair,
  - first and second output nodes outputting the first and second buffered clock signals,
  - a current source array including a plurality of parallel current sources,
  - a first switch block including a plurality of switches, each of switches being connected in series to a corresponding current source in the current source array,
  - a resistor array including resistor pairs installed corresponding to the plurality of parallel current sources, and connected to the first and second output nodes,
  - a second switch block including switch pairs connected between corresponding resistor pairs of the resistor array and a power supply terminal, respectively; and
  - an output resistance control unit connected to the current source array, the first and second input nodes, and the first and second output nodes to output the first and second buffered clock signals that are adaptively waveform-shaped according to the frequency of the first or second buffered clock signals pairs; and
- a phase interpolator configured to generate a phase interpolation clock signal selected from phases between the first and second buffered clock signals in response to a weight value of a phase interpolation control signal.

15. The phase interpolation circuit as claimed in claim 14, wherein the output resistance control unit comprises a MOS transistor array including MOS transistor pairs.

16. The phase interpolation circuit as claimed in claim 14, wherein the switches and switch pairs in the first and second switch blocks are switched according to a counting code value of a counter.

* * * * *